(12) United States Patent
Robbins (10) Patent No.: US 6,500,568 B1
(45) Date of Patent: Dec. 31, 2002

(54) BIAXIALLY TEXTURED METAL SUBSTRATE WITH PALLADIUM LAYER

(75) Inventor: William B. Robbins, Maplewood, MN (US)

(73) Assignee: 3M Innovative Properties Company, St. Paul, MN (US)

(*) Notice: Subject to any disclaimer, the term of this patent is extended or adjusted under 35 U.S.C. 154(b) by 1 day.

(21) Appl. No.: 09/875,694

(22) Filed: Jun. 6, 2001

(51) Int. Cl.[7] ............................................. B32B 15/01
(52) U.S. Cl. ...................... 428/670; 505/239; 505/814; 174/426
(58) Field of Search .......................... 428/670; 505/239, 505/814; 174/426, 404, 336, 125.1

(56) References Cited

U.S. PATENT DOCUMENTS

| | | |
|---|---|---|
| 5,432,151 A | 7/1995 | Russo et al. |
| 5,479,317 A * | 12/1995 | Ramesh ...................... 29/25.42 |
| 5,739,086 A | 4/1998 | Goyal et al. |
| 5,741,377 A | 4/1998 | Goyal et al. |
| 5,898,020 A | 4/1999 | Goyal et al. |
| 5,958,599 A | 9/1999 | Goyal et al. |
| 5,968,877 A | 10/1999 | Budai et al. |
| 5,972,847 A | 10/1999 | Feenstra et al. |
| 6,226,858 B1 * | 5/2001 | Matsumoto et al. ..... 174/125.1 |
| 6,256,521 B1 * | 7/2001 | Lee et al. .................... 505/230 |
| 6,261,704 B1 | 7/2001 | Paranthaman et al. |
| 6,349,226 B1 * | 2/2002 | Yoshino et al. .......... 174/125.1 |

FOREIGN PATENT DOCUMENTS

| | | |
|---|---|---|
| WO | WO 99/15718 | 4/1999 |
| WO | WO 99/25908 | 5/1999 |
| WO | WO 01/15245 | 3/2001 |
| WO | WO 01/26164 | 4/2001 |

OTHER PUBLICATIONS

"Continuous Deposition of Ex–Situ YBCO Precursor Films on Rolling–Assisted Biaxially Textured Substrates by Electron Beam Evaporation", W.B. Robbins, 3M Company, St. Paul, MN.

* cited by examiner

Primary Examiner—M. Alexandra Elve
Assistant Examiner—Colleen P. Cooke
(74) Attorney, Agent, or Firm—Melanie Gover (57) ABSTRACT

Described is an article comprising a biaxially textured metal substrate and a layer of palladium deposited on at least one major surface of the metal substrate; wherein the palladium layer has desired in-plane and out-of-plane crystallographic orientations, which allow subsequent layers that are applied on the article to also have the desired orientations.

20 Claims, 2 Drawing Sheets

BIAXIALLY TEXTURED METAL SUBSTRATE WITH PALLADIUM LAYER

This invention was made with Government support under Subcontract No. 4500011817 under DOE Prime Contract No. DE-AC05-00OR22725.

FIELD OF THE INVENTION

This invention relates to biaxially textured metal articles useful for subsequent fabrication of other articles, such as superconductive articles. More particularly, this invention relates to an article comprising a biaxially textured metal substrate and a layer of palladium deposited on at least one major surface of the metal substrate; wherein the palladium layer has desired in-plane and out-of-plane crystallographic orientations.

BACKGROUND OF THE INVENTION

Current research in the area of high temperature superconductivity includes use of thin-film materials deposited on metal or coated metal substrates. Many of these applications require the substrate and any buffer layers to have certain in-plane and out-of-plane crystallographic orientations to allow for and enhance the conductivity of the superconductive layer(s) deposited on the substrates and buffer layers. The grain boundaries between crystals in the conductive layer of some classes of superconductors should be minimized to enhance the superconductivity of the layer, which is based upon minimizing the grain boundaries in the substrate and buffer layers.

$YBa_2Cu_3O_{7-x}$ (YBCO), where x is a number between 0.05 and 0.5, is an important superconducting material for the development of superconducting current leads, transmission lines, motor and magnetic windings, and other electrical conductor applications. When cooled below their transition temperature, superconducting materials, such as YBCO, have no direct current (DC) electrical resistance and carry DC electrical current without heating. One technique for fabricating a superconducting wire or tape is to deposit a YBCO film on a metallic substrate. Superconducting YBCO has been deposited on biaxially textured metals, and is adversely affected by diffusion of ion species between the YBCO and the metal substrate. To carry high electrical current and remain superconducting, however, the YBCO films must also have substantially uniform in-plane orientation, with effectively no large-angle grain boundaries caused by epitaxial growth on substrates having non-uniform crystal orientation. Such grain boundaries are detrimental to the current-carrying capability of the YBCO material. Therefore, a multilayered buffer stack is used between YBCO and the biaxially textured metal substrates to minimize adverse formation of impurities and undesired phases.

Nickel is commonly used as the biaxially textured metallic substrate upon which the multiple buffer layers and the YBCO are deposited. A common set of buffer layers that are applied between the nickel and the YBCO layer include a layer of yttrium-stabilized zirconium (YSZ) sandwiched between two layers of cerium oxide ($CeO_2$). The first layer of $CeO_2$ in the buffer layer can be deposited by radio frequency (RF) sputtering of $CeO_2$ from a ceramic target onto the surface of the nickel while the YSZ layer and second $CeO_2$ layer are typically RF sputtered. The RF sputtering process is quite slow, therefore making the production of the superconducting material using such a process an even slower process.

SUMMARY OF THE INVENTION

The inventor recognized that a need exists for an article upon which to ultimately deposit YBCO, and any necessary buffer layers, which permits use of faster deposition processes for applying layers to the substrate. The inventor also recognized that the article should allow for effective replication of a biaxially textured, crystalline, metallic substrate that has the proper in-plane and out-of-plane crystalline orientations to allow for efficient superconductivity of the YBCO layer. High critical current densities ($J_c$), representing good superconductivity, can only be obtained for YBCO films that are oriented with a high degree of both in-plane and out-of-plane crystalline texture. In addition, the inventor recognized the need for the article to be able to be quickly coated with the buffer layers to result in more rapid production of superconducting material. In effect, the inventor was looking for a substrate that would allow for production of the superconducting material in a continuous process and at a high rate of speed. The inventor recognized that reactive sputtering, rather than RF sputtering, would be an efficient and rapid way of coating the subsequent layers on the biaxially textured metal substrate, and ultimately recognized the need for a barrier layer of palladium (Pd) on the metal substrate to allow for reactive sputtering to be used. The inventor further recognized that desired in-plane and out-of-plane crystallographic orientations of the biaxially textured metal substrate were able to be replicated in the subsequent layers when a layer of Pd was coated on the biaxially textured metal substrate prior to the barrier layers and superconducting layer(s). The inventor also recognized that preferably the layer of Pd was up to about 11 nanometers thick. The inventor further recognized that the Pd layer would allow reactive sputtering to be used because the layer would act as a barrier between the metal substrate and the oxide layer that is subsequently applied to the substrate, while also allowing replication of the desired crystallographic orientations of the biaxially textured metal substrate.

The present invention provides an article comprising: a biaxially-textured metal substrate; and a layer of palladium deposited on at least one major surface of said metal substrate; wherein at least about 90% of the crystals of said palladium layer have an out-of-plane crystallographic orientation of (002), and wherein at least about 85% of said crystals of said palladium layer have an in-plane crystallographic orientation with respect to the metal substrate that is cube-on-cube or at least about 85% of said crystals of said palladium layer have an in-plane crystallographic orientation with respect to the metal substrate that is 45 degree rotated.

In a preferred embodiment of the invention the metal that comprises said substrate is nickel (Ni), a nickel alloy or copper. In another embodiment, the nickel is a high purity nickel foil. In yet another embodiment, the nickel foil is from about 20 to about 60 micrometers thick.

In another preferred embodiment, the layer of palladium is up to about 11 nanometers thick. In yet another preferred embodiment, the layer of palladium is up to about 8 nanometers (nm) thick.

In a preferred embodiment of the invention, at least about 95% of the crystals of said palladium layer have the out-of-plane crystallographic orientation of (002). In a further preferred embodiment, at least about 99% of the crystals of said palladium layer have the out-of-plane orientation of (002).

In a preferred embodiment of the invention, at least about 90% of said crystals of said palladium layer have an in-plane crystallographic orientation with respect to the metal substrate that is cube-on-cube or at least about 90% of said crystals of said palladium layer have an in-plane crystallographic orientation with respect to the metal substrate that is 45 degree rotated. In a further preferred embodiment, at least about 94% of said crystals of said palladium layer have an in-plane crystallographic orientation with respect to the metal substrate that is cube-on-cube or at least about 94% of said crystals of said palladium layer have an in-plane crystallographic orientation with respect to the metal substrate that is 45 degree rotated.

Another embodiment of the invention is an article useful for making a superconductive article comprising: a biaxially-textured metal substrate; and a layer of palladium deposited on at least one major surface of said metal substrate; wherein at least about 90% of the crystals of said palladium layer have an out-of-plane crystallographic orientation of (002), wherein at least about 85% of said crystals of said palladium layer have an in-plane crystallographic orientation that has either an average of about 0 degrees or an average of about 45 degrees, and wherein said superconductive article comprises said article, which is a substrate for layers that further comprise said superconductive article.

Additional embodiments of the present invention are described in the detailed description of the invention or the claims, which are below.

An advantage of at least one embodiment of the present invention is that the layer of Pd on the Ni allows for proper replication of the desired crystalline structure of the biaxially textured metal substrate, while at the same time providing a barrier so that reactive sputtering may be used to apply the subsequent layers on the metal/palladium substrate quickly and efficiently.

Further advantages of the present invention are described in the detailed description of the invention below.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the invention is not limited to the particular embodiments described. On the contrary, the intention is to cover all modifications, equivalents, and alternatives falling within the spirit and scope of the invention as defined by the appended claims.

DETAILED DESCRIPTION OF THE INVENTION

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The present invention is an article that acts as a support or substrate layer for subsequent deposition of layers by reactive sputtering that sufficiently replicate the crystalline structure of the article. The Pd layer of the present invention provides a protective coating on the metallic substrate, which has a desired crystalline structure, that allows for reactive sputtering on the surface of the article while avoiding the adverse reactions that could result between the metallic substrate and the subsequently deposited layers.

One use of the present inventive article is as a support or substrate for high temperature superconductive articles. High temperature superconductive articles are those having a critical temperature significantly above 0 degrees Kelvin. Typically they comprise a substrate layer, a multilayered buffer structure, a superconducting layer, and a protective overcoat. The present inventive article is suitable for providing epitaxial deposition of the subsequent buffer and superconducting layers to make the high temperature superconductive articles. Preferably a multilayered buffer structure between the present inventive article and the superconducting layer is composed of an epitaxial layer of yttrium-stabilized zirconium (YSZ) sandwiched between two layers of cerium oxide ($CeO_2$). Preferably, the superconducting layer is a layer made of an epitaxial layer of yttrium-barium-copper-oxide (YBCO).

Figure 1:
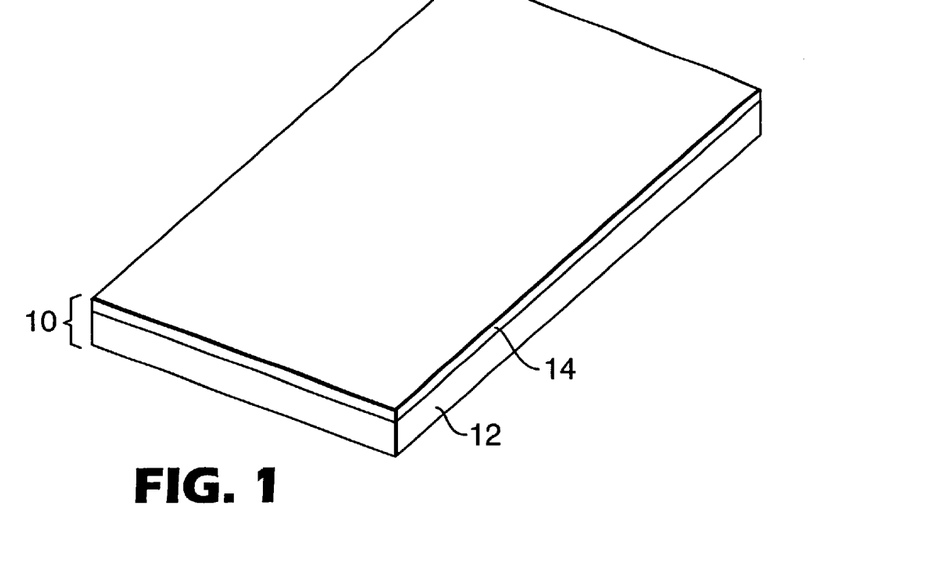
FIG. 1 is a schematic drawing of the present inventive article.

An article in accordance with the present invention 10, shown schematically in

FIG. 1, generally comprises a biaxially textured metal substrate 12, and a layer of Pd 14.

Figure 2:
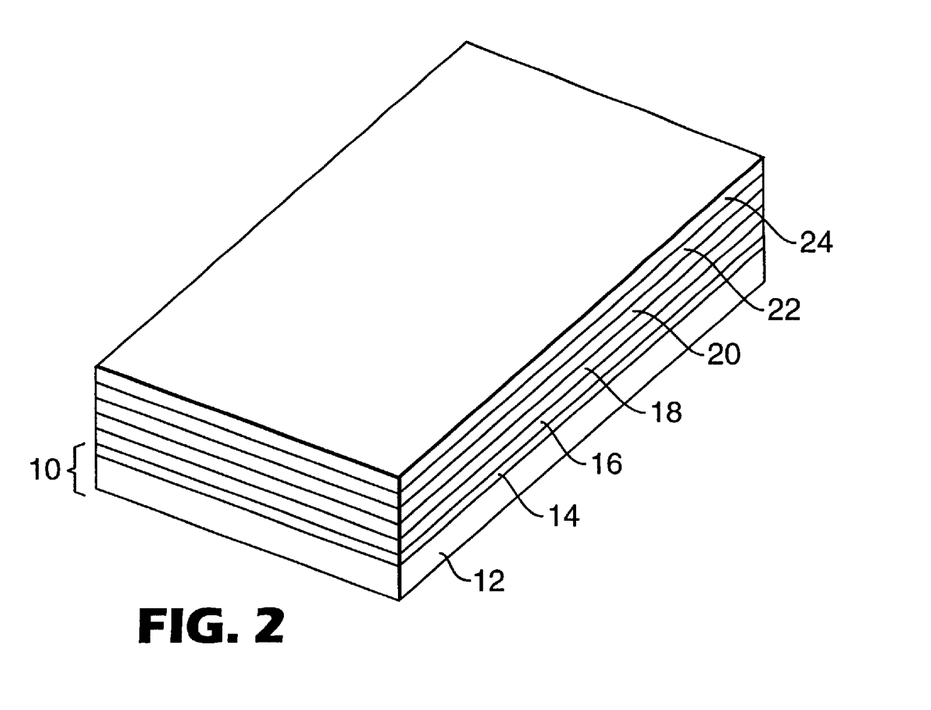
FIG. 2 is a schematic drawing of the present inventive article coated with the subsequent layers to form a superconductive article.

FIG. 2 then shows the article of the present application 10 with the subsequent buffer and superconducting layers (16, 18, 20, 22, 24) coated on the article 10 and resulting in a superconductive article.

Metal Substrate

The substrate 12 in the present inventive article 10 is made of a metal. Preferably the metal is in the form of a foil. A "foil" is a thin, flexible sheet of metal.

Preferably the metal is nickel (Ni). A high purity nickel is preferred. The thickness of the nickel foil is typically about 10 to 200 micrometers thick, and is preferred to be about 20 to about 60 micrometers thick, although another thickness may be used.

The nickel foil that may be used in the present invention has a desired texture. In order for the nickel to have the desired texture, a multi-step process is used to prepare the surface of the nickel substrate. The nickel substrate is produced using a powder metallurgy process with powder produced from nickel carbonyl. The nickel powder is first rolled, then annealed and rolled again. During the rolling process, plastic flow causes reorientation of the lattices of individual grains of nickel, and tends to develop a texture or preferred orientation of the lattice in the grains. The process of reorientation is gradual; the orientation change proceeds as plastic flow continues until a texture is reached that is stable against indefinite continued flow of a given type. The Ni is annealed first at a thickness of about 2.54 millimeters and is then rolled to a thickness of about 0.051 millimeters. After rolling, the Ni is cleaned in caustic aqueous metal cleaner and annealed at about 1105° C. for about 5 minutes at atmospheric pressure in hydrogen gas vaporized from liquid hydrogen. A smooth nickel foil substrate results from the process described. The nickel foil is not a single layer of nickel crystals, however, after full anneal, it may approximate a single layer.

All nickel processing, including annealing and slitting (the process of converting a wide strip of foil into a multiplicity of narrower strips), is performed roll-to-roll. The surface of the Ni becomes approximately ten times smoother after annealing. This effect is referred to as "thermal smoothing." The Ni also becomes smoother as the reduction ratio (the ratio between the thickness of foil after the first anneal and the thickness after the final anneal) is increased. The Ni becomes seven times smoother if a 50:1 reduction ratio is used rather than a 30:1 reduction ratio. Annealing at atmospheric pressure rather than highly reduced pressure results in significantly reduced depth of grain boundary grooving. The dihedral angle of grain boundary grooving is not changed by pressure during annealing.

Immediately prior to modification of the Ni by sputtering of Pd, the Ni is further cleaned and annealed. The nickel substrate is passed from an unwind roll to a windup roll. As the nickel foil is unrolled, it encounters a combined cleaning and annealing step. The nickel substrate is resistively heated using an electrical current flowing through the nickel. It is preferably heated to approximately 1050° C. at total pressure of 0.47 Pa (3.5 mTorr) in an atmosphere of argon (89%) and hydrogen (11%). The current required is 3.0 A/mm width for the 0.0508 mm thick nickel foil. The time necessary for a point on the nickel to pass through this process is about 2.4 minutes. This annealing time, in addition to the initial anneal performed in hydrogen at atmospheric pressure, contributes to the quality of the texture of the nickel substrate. No secondary recrystallization of the nickel substrate has been observed.

In addition to pure Ni, other metals may be used as the substrate of the present invention. Examples include, but are not limited to, copper, copper alloys, and nickel alloys. These other metals may be made into the biaxially textured metal substrate using the same process as, or a similar process to, the one described above.

Ni with about 3 to about 9 atomic percent tungsten or Ni with about 4 to about 13 atomic percent chromium are both nickel alloys that may be used in the present invention. When compared with pure Ni, these nickel alloys have greater stiffness and strength and reduced magnetic moment.

The better the substrate texture (i.e. smoothness and crystalline structure), the better the properties of the layers deposited on the substrate are expected to be. It is important that the surface of the substrate be smooth. It is preferred that the root mean square (RMS) surface roughness is less than about 0.6 nm. It is also important that the substrate contain the desired in-plane and out-of-plane crystalline structure.

Layer of Palladium

The article comprises a metal substrate and a layer of palladium (Pd) on at least one major surface of the substrate. The Pd layer is to be conducive to deposition of subsequent layers.

The Pd layer can be deposited by vapor phase techniques known in the art, such as sputtering, evaporation, or pulsed laser deposition (PLD). It is applied at substrate temperatures in the range from near room temperature to 400° C., preferably in the range of 40° C. to 140° C.

Both the in-plane and out-of-plane crystallographic orientations of the crystals of the Pd layer are important to this invention. Each is inferred from X-ray diffraction (XRD) measurements of subsequent layers deposited onto the Pd layer. These layers could include the $CeO_2$ seed layer, the YSZ layer and the $CeO_2$ cap layer. It is difficult to measure the crystallographic orientation of the Pd layer itself by XRD because the layer is so thin. The orientation of the crystals of the Pd layer is inferred to mimic or replicate the orientation of the crystals of the metal substrate.

The desired out-of-plane crystallographic orientation of the layer is (002) in the present inventive article. The numerical representation, (002), is called a Miller index. The Miller index is used to define a crystal plane, which is defined by the intercepts of the plane with the three crystal axes. The Miller index for the plane is a set of 3 integers that describe the orientation of the plane with respect to coordinate axes a, b, and c. (See *Material Crystal Chemistry*, by Relva Buchanan and Taeun Park, Marcel Dekker, Inc., 1997, Chap. 2).

Crystal orientation, both out-of-plane and in-plane, can be measured by XRD. Such measurement techniques are described in *Elements of X-ray Diffraction*, by Bernard Dennis Cullity, Addison-Wesley Pub. Co., Reading, Mass., 1957.

The amount of crystals in the out-of-plane orientation of (002) must be significant in order for the layer to be conducive to epitaxial deposition of additional layers to form a superconductive material. The (002) crystalline content of the Pd layer should be at least about 90%. More preferably, the (002) content would be at least about 95%, and most preferably it would be at least about 99%.

In-plane orientation is also important. The in-plane rotation of cubic crystals is determined by reflecting x-rays off the (111) surface of the crystal as the sample is rotated about a z-axis. Thus, cubic crystalline structures have an in-plane orientation where cubic crystals of a second layer are substantially aligned with cubic crystals of the biaxially textured metal substrate. This is described as "cube-on-cube" with respect to the metal substrate and is shown by XRD signals that are every 90 degrees beginning at 45 degrees. Similarly, cubic crystals of a second layer are described as having a "45 degree rotated " in-plane orientation, where the cubic crystals of the second layer are rotated 45 degrees with respect to the cubic crystals of the biaxially textured metal substrate. The "45 degree rotated" orientation is shown by XRD signals that are every 90 degrees beginning at 0 degrees.

The in-plane crystallographic orientation of the cubic crystals of the Pd layer of the invention is preferred to be almost all of either a cube-on-cube orientation or a 45 degree rotated orientation. Either one will be functional, but most of the crystals must be of only one type of rotation (either a cube-on-cube orientation or a 45 degree rotated orientation). The in-plane crystallographic orientation of at least about 85% of the crystals should be one type of rotation (either a cube-on-cube orientation or a 45 degree rotated orientation). Therefore, the in-plane rotation exhibits at least about 85% of said crystals of said palladium layer having an in-plane crystallographic orientation with respect to the metal substrate that is cube-on-cube or at least about 85% of said crystals of said palladium layer having an in-plane crystallographic orientation with respect to the metal substrate that is 45 degree rotated. Preferably, at least about 90% of said crystals of said palladium layer have an in-plane crystallographic orientation with respect to the metal substrate that is cube-on-cube or at least about 90% of said crystals of said palladium layer have an in-plane crystallographic orientation with respect to the metal substrate that is 45 degree rotated. And, most preferably, at least about 94% of said crystals of said palladium layer have an in-plane crystallographic orientation with respect to the metal substrate that is cube-on-cube or at least about 94% of said crystals of said palladium layer have an in-plane crystallographic orientation with respect to the metal substrate that is 45 degree rotated.

Figure 3A:
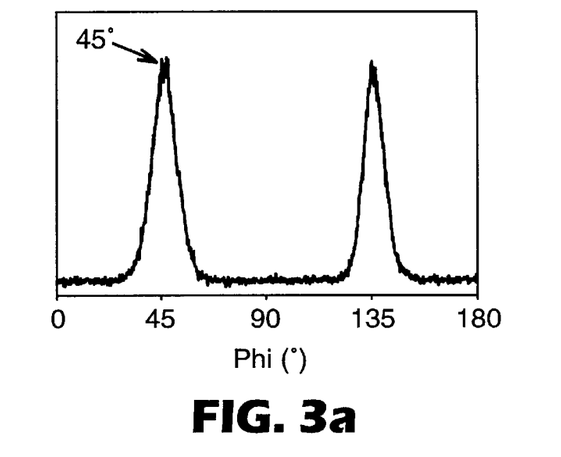
FIGS. 3a, 3b and 3c are graphs of the X-ray diffraction, showing in-plane crystallographic orientation, of a $CeO_2$ seed layer coated onto a biaxially textured nickel substrate having no palladium layer (3a), of a $CeO_2$ seed layer coated on a biaxially textured nickel substrate having a palladium layer with a thickness of 6.0 nm (Example 1C) (3b), and of a $CeO_2$ seed layer coated on a biaxially textured nickel substrate having a palladium layer with a thickness of 17 nanometers (Example 1E) (3c).
Figure 3B:
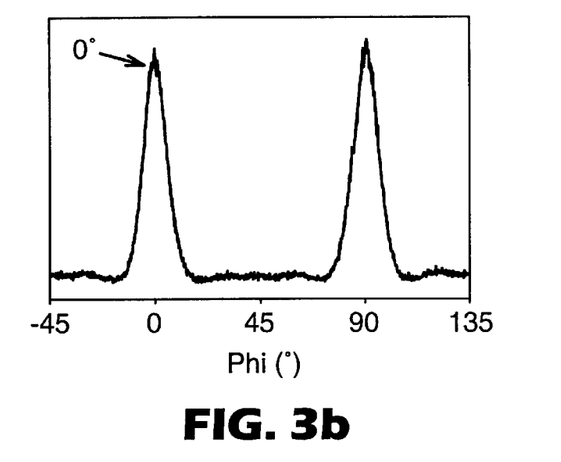
Figure 3C:
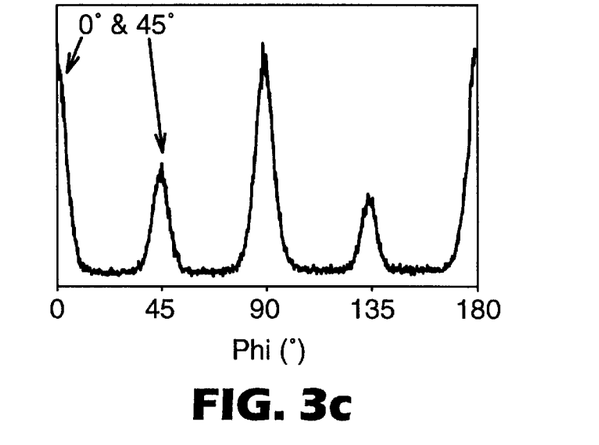

FIGS. 3a–3c illustrate XRD patterns for cubic crystals having in-plane orientations of cube-on-cube, rotated 45 degrees and a mixture of both. The "cube-on-plane cube" orientation, as discussed earlier, is denoted by the readings of 45 degrees and 135 degrees in the Figures, while the "45 degree rotated" orientation is denoted by the readings of 0 degrees and 90 degrees. FIG. 3a, which has no Pd layer at all, shows a sample with nearly all of the Ni crystals in an in-plane orientation of cube-on-cube. FIG. 3b, which has a Pd layer with a thickness of 6 nm, shows a sample with nearly all of the crystals of the $CeO_2$ seed layer in an in-plane orientation of cube-on-cube with respect to the Ni substrate. It is inferred that the Pd layer beneath has a similar in-plane orientation. FIG. 3c, which has a Pd layer with a thickness of 17 nm, shows a sample with the majority of the $CeO_2$ crystals in an in-plane orientation of cube-on-cube but with a significant amount having an orientation associates with 45 degrees rotated. It is inferred that the Pd layer beneath has a similar mixture of in-plane orientations relative to the Ni substrate.

As seen in FIGS. 3a–3c, signals at 0 degrees and 45 degrees are now shown as sharp lines but as populations of counts about either 0 degrees or 45 degrees. By using the numbers of degrees of 0 and 45 in the present application, it is not meant that all of the crystals are rotated at exactly 0 or 45 degrees. What is meant is that the distribution about either 45 degrees or 0 degrees (whichever is referred to) is within a full-width-half maximum of 10 degrees, preferably 8 degrees, and more preferably 4 degrees.

The Pd layer that is deposited on at least one major surface of the metal substrate is of a thickness of up to about 11 nanometers thick. Preferably, the thickness of the Pd layer is up to about 8 nanometers thick. More preferably, the thickness of the Pd layer is up to about 4 nanometers thick.

Subsequent Layers

The present inventive article 10 may be used to make another article by depositing subsequent layers on the article 10. One example of such an article that may be used by depositing layers on the present inventive article is a superconductive article. One embodiment of such a superconductive article is shown in FIG. 2. The metal substrate 12, preferably nickel foil, may have a thickness of about 20 to about 60 micrometers and surface with a crystalline morphology of nearly 100% (002) out-of-plane orientation. The next layer is the Pd layer 14, which is deposited epitaxially on the metal substrate 12. The Pd layer replicates the out-of-plane orientation of the nickel substrate, which should be at least 90% (002).

Between the Pd layer 14 and the super-conducting layer 22, of FIG. 2, there is a buffer layer. The buffer layer, as shown in the Figure, is commonly comprised of a three-layer sandwich containing a layer of YSZ 18 between two layers of $CeO_2$ (16, 20). The bottom $CeO_2$ layer 16 is referred to as the seed layer, while the other $CeO_2$ layer 20 is referred to as the cap layer. The layers of the buffer layer replicate the in-plane and out-of-plane crystallographic structure of the Pd layer. The superconducting layer 22 that is coated over the buffer layer is preferably YBCO, a superconducting material replicating the crystalline structure onto which it is deposited. An optional layer of silver (Ag) 24 may be coated over the YBCO layer.

A purpose of the Pd layer 14 is to minimize the formation of intermetallic nickel cerium (predominantly $Ni_5Ce$ was observed) on the surface of the Ni substrate 12 proximate the $CeO_2$ 16. Nickel cerium tends to cause nickel to reconfigure its crystalline morphology away from (002). Pd tends to satisfactorily minimize competing reaction of cerium with Ni as $CeO_2$ is formed on the Pd protected, Ni surface. The conductivity of superconductive articles is severely decreased if the YBCO layer deviates substantially from a (002) crystalline structure. This can occur if the crystalline orientation of the $CeO_2$ layer changes from (002) through loss of oxygen or if the crystalline orientation of the surface of the metal sublayer deviates substantially from a (002) crystalline structure.

Sputter deposition of a metal oxide can be done by either conventional techniques or by reactive techniques. Conventional techniques require applying a radio frequency alternating current to a metal oxide target to dislodge metal oxide in a vapor state. The metal oxide vapor subsequently coalesces onto a desired biaxially-textured metal substrate. Because the metal oxide is typically non-conductive, slow sputter deposition rates occur. For applying 25 nm of $CeO_2$, 160 nm of YSZ or 25 nm of $CeO_2$, typical speeds used are 0.5 mm/minute, 1.0 mm/minute and 0.5 mm/minute, respectively. In contrast, reactive sputtering techniques require applying an electrical current to a metal target in the presence of a reactive gas such as oxygen, water, or nitrogen. The metal vapor coalesces onto the biaxially textured metal substrate and the reactive gas reacts with the coalesced metal to form a metal oxide. Because the metal generally is conductive, deposition rates are much faster. For applying 25 nm of $CeO_2$, 160 nm of YSZ or 25 nm of $CeO_2$, typical speeds are 300 mm per minute. In these cases, reactive sputtering resulted in comparable depositions up to 300 times faster than that achieved by traditional sputter deposition techniques.

Although reactive sputtering of a material having high conductivity and later transforming it into a low conductivity material is faster than traditional sputtering, potential adverse reactions need to be minimized. When the biaxially textured substrate is also reactive to the reactive gas that is present, competing reactions may occur that often may result in different crystalline structures of the material that is deposited. These different structures may be replicated in subsequent layers as they are deposited on the layer. A layer of Pd, such as that in the present inventive article, significantly decreases the occurrence of adverse reactions when reactive sputtering deposition is used to apply the subsequent layers onto the biaxially textured metal substrate.

The present inventive article is not only useful as a substrate for making a superconductive article using reactive sputtering. Another example of a use for the present inventive article is as a substrate for making a superconductive article by metal oxide chemical vapor deposition. Yet another use of the inventive article is as a substrate for making a superconductive article using a sol-gel process.

This invention is further illustrated by the following Examples, which are not intended to limit the scope of the invention.

EXAMPLES

Testing Procedures

The following tests have been used to evaluate the invention.

Critical Current Density

Critical current density ($J_c$) was determined by measuring the current at which a voltage difference occurred of at least 1 microvolt per cm ($\mu V/cm$) at the temperature of liquid nitrogen (77° K). A sample was placed in liquid nitrogen. Buffer layers had been previously applied on the Pd layer that was deposited on the modified nickel foil of the invention. Then a layer of superconductor, YBCO, and a protective layer of silver had been applied. A four-point probe was used in conjunction with a constant current source and a millivolt electrometer to measure conductance. Each probe point was spaced about 10 millimeters (mm) apart in a line in contact with the surface of the silver. Current was varied until an electrical field occurred along the conductor that was at least $1.0 \mu V/cm$. The current at that point was divided by the area of the current carrying material, and that is the critical current density in megaamps per square centimeter ($MA/cm^2$).

Out-Of-Plane Rotation

The out-of-plane orientation of the Pd layer was determined inferentially by measuring the out-of-plane orientation of either the $CeO_2$ seed layer or YSZ layer that was subsequently applied. XRD was used to measure out-of-plane orientation. Although the YSZ layer was sandwiched between two layers of $CeO_2$, the rotation was determined from measurements from the YSZ layer because its greater thickness resulted in stronger signals. Samples were cut to about 10 mm×20 mm and placed in an x-ray diffractometer that measured a sample area having about a 3 mm diameter. Background noise (noted as $M_0$) was determined by measuring the counting rate of the X-ray system when it was set to an angle away from any diffraction peak. Then X-ray diffraction spots of both (002) crystal orientation (noted as $M_1$) and (111) crystal orientation (noted as $M_2$) were measured. Percent out-of-plane rotation for each was obtained by reducing each orientation count rate by the background noise rate and then calculating the percentage that each orientation comprised of the total orientated crystal population. Thus, the percent of (002) orientation (noted as $M_3$), was:

$$M_3 = 100 \times (M_1 - M_0)/[(M_1 - M_0) + (M_2 - M_0)]$$

Conversely the percent of (111) orientation (noted as $M_4$) was:

$$M_4 = 100 - M_3$$

In-Plane Rotation

The in-plane rotation of the Pd layer was determined inferentially by measuring the in-plane rotation of the either the $CeO_2$ seed layer or YSZ layer that were subsequently applied. XRD was used to measure in-plane orientation. Samples were cut to about 10 mm×20 mm and placed in a x-ray diffractometer that measured the area of a spot having about 3 mm diameter. X-ray scans were made and results were shown in displays similar to these of FIGS. 3a–3c illustrating populations of count rates with averages with peaks at either 0 degrees (peak height noted as $M_1$) or 45 degrees (peak height noted as $M_2$). For each sample the percent in-plane rotation of a specific rotation was determined as a fractional percent of the peak heights. Thus, the percent of 0 degree orientation (noted as $M_3$), was:

$$M_3 = 100 \times (M_1)/(M_1 + M_2)$$

Conversely the percent of (111) orientation (noted as $M_4$) was:

$$M_4 = 100 - M_3$$

Process for Making and Evaluating Palladium-Modified Nickel Substrates

Six steps were used: (1) nickel foil fabrication, (2) foil cleaning and annealing, (3) Pd deposition, (4) buffer layer deposition, (5) YBCO deposition and (6) silver deposition. The first two steps provided suitable clean and biaxially textured nickel foil. The third step modified the foil to provide a biaxially textured surface resistant to adverse migration of species between the base nickel layer and subsequent proximate metal oxide layer deposited under reactive sputtering conditions. The fourth step provided either one buffer layer or three buffer layers from which crystal orientation was measured and inferred to the palladium layer. All three buffer layers were applied when use of the invention was evaluated as a substrate for a superconductive article. The fifth step applied a superconductive precursor layer onto the foil construction and converted the precursor to YBCO for determination of the critical current density obtained with superconducting foil made with the invention. The sixth step applied a protective layer onto the YBCO layer to protect the superconducting layer.

(1) Nickel Foil Fabrication

The nickel foil, prepared by Hamilton Precision Metals, Lancaster, Pa., was made in a manner substantially similar to the teachings of U.S. Pat. Nos. 5,739,086 and 5,741,377, both by Goyal et al. Biaxially textured nickel foil, produced from nickel carbonyl using a powder metallurgy process, was annealed at atmospheric pressure at a thickness of 2.54 mm (0.100 inches) and rolled to a thickness of 0.0508 mm, a 50:1 reduction ratio. A pickling step occurred at an intermediate thickness of 0.25 mm (0.010 inch) to remove surface contamination. After rolling, the nickel was cleaned in caustic aqueous metal cleaner and annealed at 1105° C. for 5 minutes at atmospheric pressure in hydrogen gas vaporized from liquid.

Alternatively, an alloy of nickel with 3 atomic percent tungsten (9 wt %) may be fabricated, handled and used as a substrate in much the same fashion as the above-described nickel. When compared with pure nickel, the alloy had greater stiffness and strength and reduced magnetic moment.

(2) Nickel Foil Cleaning and Annealing

Rolls of biaxially textured nickel foil, obtained from the first operation, were loaded into a stainless steel vacuum system and pumped to a base pressure of $2.67 \times 10^{-5}$ Pa ($2 \times 10^{-7}$ Torr). Speed at which nickel foil passed through the system was typically 5.1 mm/s (1 ft/min) and tension was 0.015 N/mm width of web. The vacuum system was sealed with a combination of copper gaskets and o-ring seals.

To clean and anneal the nickel foil, the foil was resistively heated to approximately 1050° C. by passing current through rolling contacts. The heating was done in an atmosphere of argon (89 vol. %) and hydrogen (11 vol. %) at total pressure of 0.47 Pa (3.5 mTorr). Current used was 3.0 A/mm width for the 0.0508 mm thick nickel foil. The time that it took for a point on the nickel to pass through the process was 2.4 minutes.

(3) Pd Deposition

Next, Pd was applied to the heated nickel foil using a magnetically-assisted sputtering process using a direct current power supply (available as Model MDX500 from Advanced Energy, Inc., Fort Collins, Colo.) to a thickness of between 1.5 and 17 nm (1.8–20.4 $\mu g/cm^2$). The sputtering power density applied to the palladium target to provide the Pd layer thickness ranged from 12 watts (W) to 140 W. The distance between the Pd target and the nickel foil was about 49 mm. The Pd deposition occurred as the nickel foil contacted a metal roll maintained at about 40° C. Process conditions that were varied were sputtering power, partial pressure of hydrogen and partial pressure of argon. The presence of water was kept to a minimum by using, within the vacuum system, a coiled tube cooled with liquid nitrogen to trap water.

(4) Subsequent Buffer Layer Deposition

Subsequent layers of either a seed layer of $CeO_2$ ("seed layer") or a three layer system comprising a seed layer, a layer of YSZ and a cap layer of $CeO_2$ ("cap layer"), as taught in PCT Int'l App. No. WO 99/15718, were applied to the samples by reactive sputtering techniques known to the art.

When only a seed layer was applied, the following process conditions were used. Heating current was 0.8 A/mm width and $CeO_2$ sputtering power was 2.75 W/cm². Flow-rates of argon and water were $1.00 \times 10^{-4}$ m³/s (0.60 L/min) and $8.0 \times 10^{-7}$ m³/s (4.8 cc/min) at standard temperature and pressure (STP) conditions of 273° K and 101 kPa (1 atmosphere). The distance between the sputtering cerium target and the Ni substrate was 57 mm. The thickness of the seed layer was about 240 nm as measured by Rutherford back-scattering spectrometry.

When a three layer buffer system was applied, a seed layer was followed with a YSZ layer and then a cap layer. The thickness of the layers was measured by Rutherford back-scattering spectrometry. The $CeO_2$ seed layer was applied with a heating current of 0.92 A/mm width, $CeO_2$ sputtering power of 3.0 W/cm2, argon flow-rate of $1.07 \times 10^{-4}$ m³/s (0.64 L/min) at STP, water flow-rate of $4.3 \times 10^{31\ 7}$ m³/s (2.55 cc/min) at STP and a distance between the sputtering cerium target and the Ni substrate of 57 mm. The resulting seed layer thickness was about 24 nm.

The YSZ layer was applied with a heating current of 1.66 A/mm width, $CeO_2$ sputtering power of 30 W/cm², argon flow-rate of $6.7 \times 10^{-5}$ m³/s(0.40 L/min) at STP, water flow-rate of $2.4 \times 10^{-5}$ m³/s(143 cc/min) at STP and a distance between the sputtering cerium target and the Ni substrate of about 52 mm. The ratio of yttrium metal to zirconium metal was 16.8 to 83.2 mole %. The resulting YSZ layer thickness was about 160 nm.

The $CeO_2$ cap layer was applied with a heating current of 0.625 A/mm width, $CeO_2$ sputtering power of 3.0 W/cm², argon flow-rate of $3.3 \times 10^{31\ 5}$ m³/s(0.20 L/min) at STP, water flow-rate of $1.8 \times 10^{-7}$ m³/s(1.08 cc/min) at STP and a distance between the sputtering cerium target and the nickel substrate of 48 mm. The resulting seed layer thickness was about 24 nm.

(5) Superconductive Layer Deposition

After deposition of the buffer layers, the material was coated with YBCO in a manner taught in U.S. Pat. No. 5,972,847. YBCO precursors were deposited and the layer was subsequently oxidized, (6) Protective Layer Deposition That construction was then coated with silver to protect the YBCO layer from adverse degradation reactions in a manner similar to those known to the art. Following deposition of Ag, the construction was evaluated for conductivity.

Example 1

The effect that the thickness of the Pd layer on the nickel foil, or substrate, had on the crystal orientation of the deposited Pd layer was examined.

The thickness of the Pd layer that was deposited onto the nickel foil was varied. Process conditions of heating current, Pd sputtering power and resulting deposition thickness, and partial pressures of argon, hydrogen and water are shown in Table 1.

TABLE 1

| | Pd Sputtering | | Partial Pressure | | |
|---|---|---|---|---|---|
| Example | Power W | Thickness nm | Argon Pa (mTorr) | Hydrogen Pa (mTorr) | Water Pa (mTorr) |
| 1A | 12 | 1.5 | 0.55 (4.10) | 0.044 (0.336) | 0.0013 (0.01) |
| 1B | 24 | 3.0 | 0.55 (4.10) | 0.044 (0.336) | 0.0013 (0.01) |
| 1C | 48 | 6.0 | 0.55 (4.10) | 0.044 (0.336) | 0.0013 (0.01) |
| 1D | 72 | 9.0 | 0.55 (4.10) | 0.044 (0.336) | 0.0013 (0.01) |
| 1E | 140 | 17.0 | 0.55 (4.10) | 0.044 (0.336) | 0.0013 (0.01) |

$CeO_2$ seed layer was applied by reactive sputtering to each sample over the Pd layer. The samples were measured for out-of-plane crystal orientation and in-plane crystal orientation of the seed layer. Results are shown in Table 2.

TABLE 2

| | | Out-of-Plane | | In-Plane | |
|---|---|---|---|---|---|
| Example | Pd Thickness nm | % (002) | % (111) | % Cube-on-cube | % 45 degree rotated |
| 1A | 1.5 | 100 | 0 | 95 | 5 |
| 1B | 3.0 | 100 | 0 | 95 | 5 |
| 1C | 6.0 | 99 | 1 | 90 | 10 |
| 1D | 9.0 | 98 | 2 | 85 | 15 |
| 1E | 17.0 | — | — | 70 | 30 |

As seen in the above table, the largest concentration of a single population in-plane rotated crystals was at least 85 percent of the total population of Pd crystals for modified nickel foils having layers of Pd of less than about 11 nm.

Example 2

The effect that a thin Pd layer on a Ni substrate had on the out-of-plane rotation orientation of the Pd crystal structure as measured by the orientation of the $CeO_2$ cap layer is demonstrated.

Pd was deposited onto nickel foil using the process conditions shown in Table 3.

TABLE 3

| | Pd Sputtering | | Partial Pressure | | |
|---|---|---|---|---|---|
| Example | Power W | Thickness nm | Argon Pa (mTorr) | Hydrogen Pa (mTorr) | Water Pa (mTorr) |
| 2A | 49 | 6.0 | 0.43 (3.23) | 0.044 (0.30) | 0.0013 (0.01) |

The samples were then coated (1) with a $CeO_2$ seed layer, a YSZ layer and a $CeO_2$ cap layer using reactive sputtering conditions, (2) with YBCO, and (3) with a silver protective layer.

The crystal orientation of the Pd layer was determined by measuring the orientation of the YSZ layer. Results are shown in Table 4.

TABLE 4

| | | | In-Plane | |
|---|---|---|---|---|
| | Pd Thickness | Out-of-Plane | % Cube-on- | % 45 degree |
| Example | nm | % (002) % (111) | cube | rotated |
| 2A | 6.0 | 98        2 | 97 | 3 |

A YBCO layer and Ag layer then were applied and the critical current density ($J_c$) was determined to be about 1 $MA/cm^2$.

What is claimed is:

1. An article comprising:
   a biaxially textured metal substrate; and
   a layer of crystallized palladium deposited on at least one major surface of said metal substrate; wherein at least about 90% of the crystals of said palladium layer have an out-of-plane crystallographic orientation of (002), and wherein at least about 85% of said crystals of said palladium layer have an in-plane crystallographic orientation with respect to the metal substrate that is cube-on-cube or at least about 85% of said crystals of said palladium layer have an in-plane crystallographic orientation with respect to the metal substrate that is 45 degree rotated.

2. The article of claim 1 wherein said metal is nickel, a nickel alloy or copper.

3. The article of claim 1 wherein said metal substrate is a high purity nickel foil.

4. The article of claim 3 wherein said nickel foil is from about 20 to about 60 micrometers thick.

5. The article of claim 1 wherein said layer of palladium is up to about 11 nanometers thick.

6. The article of claim 1 wherein said layer of palladium is up to about 8 nanometers thick.

7. The article of claim 1 wherein at least about 95% of said crystals of said palladium layer have said out-of-plane crystallographic orientation of (002).

8. The article of claim 1 wherein at least about 99% of said crystals of said palladium layer have said out-of-plane crystallographic orientation of (002).

9. The article of claim 1 wherein at least about 90% of said crystals of said palladium layer have an in-plane crystallographic orientation with respect to the metal substrate that is cube-on-cube or at least about 90% of said crystals of said palladium layer have an in-plane crystallographic orientation with respect to the metal substrate that is 45 degree rotated.

10. The article of claim 1 wherein at least about 94% of said crystals of said palladium layer have an in-plane crystallographic orientation with respect to the metal substrate that is cube-on-cube or at least about 94% of said crystals of said palladium layer have an in-plane crystallographic orientation with respect to the metal substrate that is 45 degree rotated.

11. An article useful for making a superconductive material comprising:
    a biaxially textured metal substrate; and
    a layer of palladium deposited on at least one major surface of said metal substrate;
    wherein at least about 90% of the crystals of said palladium layer have an out-of-plane crystallographic orientation of (002), wherein at least about 85% of said crystals of said palladium layer have an in-plane crystallographic orientation with respect to the metal substrate that is cube-on-cube or at least about 85% of said crystals of said palladium layer have an in-plane crystallographic orientation with respect to the metal substrate that is 45 degree rotated, and wherein said superconductive material comprises said article, which is a substrate for layers that further comprise said superconductive material.

12. The article of claim 11 wherein said metal is nickel, nickel alloy or copper.

13. The article of claim 12 wherein said nickel substrate is a high purity nickel foil.

14. The article of claim 13 wherein said nickel foil is from about 20 to about 60 micrometers thick.

15. The article of claim 11 wherein said layer of palladium is up to about 11 nanometers thick.

16. The article of claim 11 wherein said layer of palladium is up to about 8 nanometers thick.

17. The article of claim 11 wherein at least about 95% of said crystals of said palladium layer have said out-of-plane crystallographic orientation of (002).

18. The article of claim 11 wherein at least about 99% of said crystals of said palladium layer have said out-of-plane crystallographic orientation of (002).

19. The article of claim 11 wherein at least about 90% of said crystals of said palladium layer have an in-plane crystallographic orientation with respect to the metal substrate that is cube-on-cube or at least about 90% of said crystals of said palladium layer have an in-plane crystallographic orientation with respect to the metal substrate that is 45 degree rotated.

20. The article of claim 11 wherein at least about 94% of said crystals of said palladium layer have an in-plane crystallographic orientation with respect to the metal substrate that is cube-on-cube or at least about 94% of said crystals of said palladium layer have an in-plane crystallographic orientation with respect to the metal substrate that is 45 degree rotated.

* * * * *

UNITED STATES PATENT AND TRADEMARK OFFICE
CERTIFICATE OF CORRECTION

PATENT NO. : 6,500,568 B1
DATED : December 31, 2002
INVENTOR(S) : Robbins, William B.

It is certified that error appears in the above-identified patent and that said Letters Patent is hereby corrected as shown below:

Column 7,
Line 6, delete "cube-on-plane cube" and insert in place thereof -- cube-on-cube --.

Column 11,
Line 47, delete "$4.3 \times 10^{31\ 7}$" and insert in place thereof -- $4.3 \times 10^{-7}$ --.
Line 62, delete "$3.3 \times 10^{31\ 5}$" and insert in place thereof -- $3.3 \times 10^{-5}$ --.

Column 12,
Line 34, delete "$C_eO_2$" and insert in place thereof -- A $C_eO_2$ --.

Signed and Sealed this

Twenty-seventh Day of July, 2004

JON W. DUDAS
*Acting Director of the United States Patent and Trademark Office*